July 18, 1967 J. BLOEM ET AL 3,331,716

METHOD OF MANUFACTURING A SEMICONDUCTOR DEVICE BY VAPOR-DEPOSITION

Original Filed June 4, 1963

INVENTOR.
JAN BLOEM
WALTER STEINMAIER
BY
Frank R. Trifari
AGENT

United States Patent Office 3,331,716

Patented July 18, 1967

3,331,716

METHOD OF MANUFACTURING A SEMICONDUCTOR DEVICE BY VAPOR-DEPOSITION

Jan Bloem and Walter Steinmaier, Nijmegen, Netherlands, assignors to North American Philips Company, Inc., New York, N.Y., a corporation of Delaware Continuation of application Ser. No. 285,406, June 4, 1963. This application Apr. 16, 1965, Ser. No. 448,825

Claims priority, application Netherlands, June 4, 1962, 279,259

16 Claims. (Cl. 148—174)

This application is a continuation of a copending prior application, Ser. No. 285,406, filed June 4, 1963, now abandoned.

The invention relates to a method of manufacturing a semiconductor device, such as a transistor or a diode, or of manufacturing a semiconductor body for use therein, in which by deposition of semiconductor material from the gas phase, a semiconductor layer having other properties, for example another conductivity or conductivity type, than the semiconductor body is applied to a semiconductor body, whereupon this layer is coated with a layer of silicon oxide.

The application to a semiconductor body of a semiconductor layer having properties differing from those of the semiconductor body by deposition of semiconductor material from the gas or vapor phase is a method frequently used in semiconductor technology to obtain adjacent semiconductor regions having, for example, different resistivities and/or different conductivity types. The semiconductor layer may consist of another semiconductor material than that of the semiconductor body.

The semiconductor layer may be applied, for example, to the semiconductor body by evaporation in vacuum of semiconductor material or by thermal decomposition or reduction of a gaseous semiconductor compound in the proximity of the semiconductor body, semiconductor material being formed which is deposited on the semiconductor body.

After the application of the semiconductor layer, the latter is frequently provided with a protective layer of silicon oxide. In many cases, this protective layer is used as a masking layer. For this purpose, the protective layer is locally removed again after its application, after which, among other things, the resistivity and/or the conductivity type of the semiconductor layer can locally be changed, for example, by diffusion of impurities.

It has been found that the properties of the semiconductor device to be manufactured are dependent upon the condition of the surface of the semiconductor layer to which the layer of silicon oxide is applied. Foreign atoms and/or foreign ions on the surface of the semiconductor layer must be removed as thoroughly as possible before the application of the silicon oxide layer. For this purpose, in known methods the semiconductor layer is subjected before its application to an extensive cleaning process, for example, to an etching treatment, to clean its surface before the application of the silicon oxide layer.

The invention is based, among other things, on the recognition of the fact that with the use of such a cleaning process there still remains a small concentration of foreign atoms and/or foreign ions on the surface of the semiconductor layer when the silicon oxide layer is applied and that, in spite of elaborate precautions, in mass production the concentration and/or the nature of these atoms and/or ions are different in each semiconductor layer, which renders difficult the manufacture of semiconductor devices having satisfactorily reproducible properties.

It is an object of the invention to provide a method of the kind mentioned in the preamble by means of which semiconductor devices can be manufactured having satisfactorily reproducible properties, while avoiding the said circumstantial and time-consuming cleaning process. A method in accordance with the invention of manufacturing a semiconductor device, such as a transistor or a diode, in which by deposition of semiconductor material from the gas or vapor phase a semiconductor layer is applied to a semiconductor body, this layer having other properties, for example, another conductivity or conductivity type, than the semiconductor body, after which the semiconductor layer is coated with a silicon oxide layer, is characterized in that the semiconductor layer and the silicon oxide layer are provided successively in the same apparatus, and the semiconductor body is not exposed to the atmosphere between the application of the said layers. The omission of an intermediate cleaning process results in a considerable saving in time and cost, and the silicon oxide layer is applied to the clean surface of the newly applied semiconductor layer, as a result of which in mass production semiconductor devices are obtained having satisfactorily reproducible properties.

The semiconductor layer and/or the silicon oxide layer may be applied, for example, by evaporation in vacuum. To this end, the semiconductor body is placed, for example, in an apparatus for deposition by evaporation which contains a quantity of semiconductor material and a quantity of solid silicon oxide which are evaporated and deposited successively by heating.

A simple preferred embodiment of this method in accordance with the invention is characterized in that the semiconductor body is brought into contact successively with two different streams of gas, the first stream containing a gaseous semiconductor compound from which, when heated as a result of the heating of the semiconductor body, semiconductor material is formed which is deposited on the semiconductor body, while silicon oxide is formed with the aid of the second stream of gas. In contrast with the vacuum-evaporated method, there is no need for the use of vacuum pumps in this embodiment, and hence this method in accordance with the invention can be carried out in a simpler manner and more rapidly.

Very good results have been obtained when in the second stream of gas use is made of a thermally-decomposable compound from which silicon oxide is obtained by thermal decomposition, such as, for example, a compound of the group consisting of methyl silicate, ethyl silicate and the alkoxy silanes.

The quality of the silica layer may be improved if, subsequent to its contact with the first gas stream and prior to its contact with the second gas stream, the semiconductor body is brought into contact with a rinsing or flushing gas which is inert with respect to the semiconductor body and the semiconductor layer, such as, for example, hydrogen.

When a semiconductor layer of silicon is to be deposited on a semiconductor body, the said embodiments of the method in accordance with the invention are serviceable, but in this case particularly simple embodiments may be used. For example, after the application of the silicon layer, the silicon oxide layer can be obtained in a simple manner by oxidation at the surface of this silicon layer, the second stream of gas containing, for example, moist oxygen. However, this embodiment has the disadvantage that due to the formation of the silicon oxide layer, the thickness of the silicon layer is changed. A simple and important preferred embodiment which does not suffer from this limitation is characterized in that the first gas stream contains a silicon compound and a silicon layer is deposited, while after the application of the silicon layer the second gas stream and silicon oxide are formed by the addition of oxygen to the first gas stream and, if desired, by altering the proportion of the silicon compound in this gas stream. The second gas stream is obtained in a simple manner, while the use of a rinsing gas can be dispensed with.

The silicon compound may consist, for example, of a silicon-hydrogen compound. This compound is oxidized by the added oxygen, which results in the formation of silicon oxide. The oxygen may also be added in the form of a compound, for example, carbon dioxide, which has an oxidizing effect on the silicon-hydrogen compound. Preferably, however, the silicon compound is a silicon-halogen compound, the first gas stream containing hydrogen also, while the oxygen is added in a form in which water vapor is formed in the second gas stream. The water vapor reacts with the silicon-halogen compound to produce silicon oxide.

It has been found in practice that a silicon-halogen compound is more suitable than a silicon-hydrogen compound. In this case, it is possible not only to add pure oxygen to the first gas stream, but also to add oxygen compounds which together with hydrogen can form water vapor, for example, $SO_2$ and methanol vapor. A further possibility consists in that the oxygen is added to the first gas stream directly in the form of water vapor.

Oxygen is preferably added in the form of carbon dioxide since this reacts with hydrogen to form water vapor at an elevated temperature and thus upon heating of the semiconductor body—consequently only in the proximity of this body—which results in the formation of the silicon oxide from the introduced compound in the immediate proximity of the semiconductor body, which improves the quality of the silica layer, while the quantity of oxygen to be added is not very critical.

Since the semiconductor body thus produced in accordance with the invention is used for the manufacture of semiconductor devices such as transistors or diodes, it will be appreciated that it will be a monocrystal as is conventional in the art. When the body or substrate itself is a monocrystal, then the semiconductive layer produced by the vapor deposition methods above described, which as such are known in the art, will also be monocrystalline with the same crystal orientation as the substrate.

The invention will now be described more fully with reference to an embodiment and the accompanying drawing, in which.

Figures 1, 2, 3:
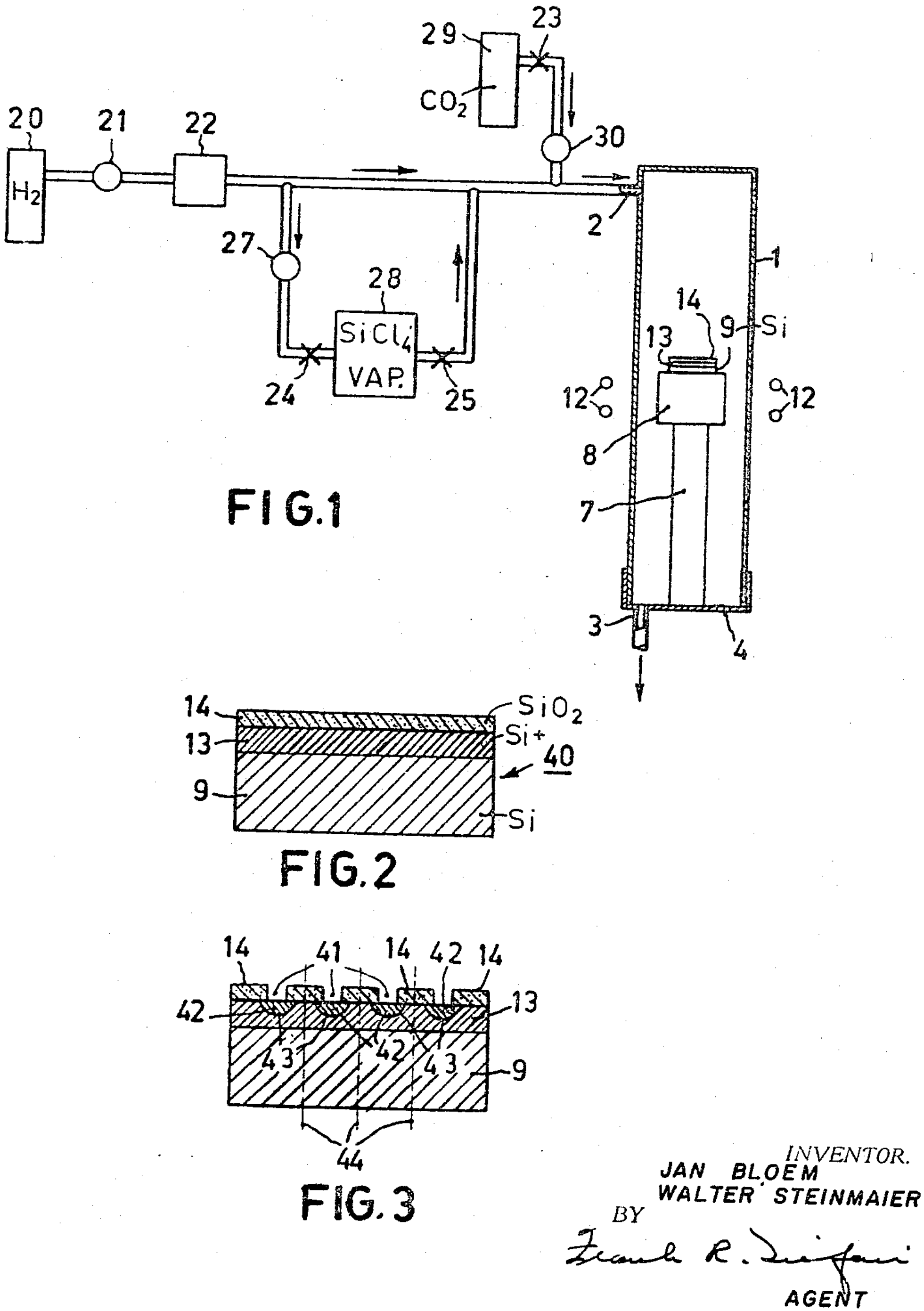
FIG. 1 shows diagrammatically an arrangement for carrying out the method in accordance with the invention.
FIG. 2 is a diagrammatic cross-sectional view of a semiconductor body on which a semiconductor layer is deposited which is coated with a silicon oxide layer.
FIG. 3 is a diagrammatic cross-sectional view of a plurality of diode structures manufactured by the use of a method in accordance with the invention.

Referring now to FIG. 1, reference numeral 1 denotes a quartz tube 1 closed at its upper end and provided with an inlet 2. The tube 1 is closed at its lower end, for example, by a detachable bottom piece 4 provided with a supporting frame 7 on which a support 8 is disposed and with an outlet 3. The bottom piece 4 and the supporting frame 7 may also be made of quartz, the support 8 consisting, for example, of silicon or carbon. A semiconductor plate or wafer 9, for example, of silicon, is placed on the support 8.

A semiconductor layer 13 must be applied to the silicon plate 9, this layer having other properties, for example another conductivity type, than the plate 9, subsequent to which this layer must be coated with a silicon oxide layer 14. These layers are applied in immediate succession in the same apparatus, in this embodiment in the quartz tube 1, to the plate 9, and this plate 9 is not exposed to the atmosphere between the applications of the said layers. Consequently, the silicon oxide layer 14 is directly applied to the clean freshly-formed surface of the semiconductor layer 13, which not only provides a simple and little time-consuming method but also yields highly reproducible results.

The support 8 may be heated by means of a high-frequency heating coil 12, as a result of which the silicon plate 9 is also heated. The silicon plate 9 is now brought into contact successively with two different streams of gas which are introduced into the quartz tube 1 through the inlet 2 and discharged from the tube 1 through the outlet 3. The first stream of gas, for example, contains a silicon compound from which by heating the plate 9, silicon is formed which is deposited on the silicon plate in the form of a silicon layer 13, while silicon oxide is formed with the aid of the second stream of gas, which results in the formation of a silicon oxide layer 14 on the semiconductor layer 13.

The second stream of gas may contain, for example, a thermally-decomposable compound from which, upon thermal decomposition, silicon oxide is formed in the proximity of the heated plate 9 and deposited on this plate. Suitable compounds are, for example, methyl silicate, ethyl silicate, the alkoxy silanes, and the like. The quality of the silicon oxide layer is further improved in that, subsequent to the application of the silicon layer and prior to the application of the silicon oxide layer, an inert rinsing gas, such as, for example, hydrogen, is passed through the tube 1.

In this embodiment, in which a semiconductor layer consisting of silicon is deposited, a simpler method is to be preferred.

Since the first stream of gas contains a silicon compound, the second stream of gas can be obtained in a simple manner by adding oxygen to the first stream of gas, which results in the formation of silicon oxide which is deposited on the silicon layer 13. In order to obtain a suitable rate of growth of the silicon oxide layer, the proportion of the silicon compound in the stream of gas may also be modified.

The silicon compound in the first stream of gas is, for example, a silicon-halogen compound, such as $SiCl_4$ or $SiHCl_3$, the first stream of gas also containing hydrogen as a carrier gas. Silicon is deposited from this stream of gas by thermal reduction, while by the addition of oxygen to this stream of gas, to form the second stream of gas, water vapor is formed with the available hydrogen, this water vapor forming silicon oxide with the available silicon-halogen compound.

The oxygen is added to the first stream of gas, for example, in the form of carbon dioxide. At an elevated temperature carbon dioxide reacts with hydrogen to form water vapor so that, upon heating the silicon plate 9, the water vapor and silicon oxide from reaction of the water vapor with the silicon-halogen compound, is formed only in the proximity of this plate, and the carbon dioxide may be added to the still cold stream of gas at a comparatively large distance from the plate 9.

The method may be carried out as follows.

The silicon plate 9—which may have a thickness of 300 microns, a diameter of approximately 25 mms., a resistivity of approximately 0.01 ohm-cm. and be of the n-conductivity type—is placed on the support 8, subsequent to which hydrogen is supplied from a gas cylinder 20 through a gas flow meter 21, a gas-purifying system 22 and the inlet 2 to the tube 1 and is conducted away again through the outlet 3 for approximately 10 minutes in order to clean the tube. For example, 1 litre of hydrogen per minute is led through at a pressure of approximately 1 atm. Valves 23, 24 and 25 are closed.

Subsequently, the plate 9 is heated by means of the high-frequency heating coil 12 to approximately 1300° C. for approximately 10 minutes. Consequently, oxides are removed from the surface of the plate 9.

The temperature of the plate 9 is then reduced to approximately 1250° C. to 1260° C., and the valves 24 and 25 are opened, while a gas flow meter 27 is adjusted to 30 cm.$^3$ of gas per minute. The gas meter 21 still continues to pass 1 litre of hydrogen per minute. Consequently, 30 cm.$^3$ of hydrogen per minute flows through a vaporizer 28 in which silicon chloride is vaporized. For example, the vaporizer 28 is kept at 20° C. The hydrogen of approximately 1 atm. flowing into the tube 1 at the inlet 2 then contains approximately 1% by volume of silicon chloride and forms the first stream of gas.

Under the said conditions, the rate of growth of the silicon layer 13 on the silicon plate 9 amounts to approximately 1μ/min. Under the same conditions, the silicon layer 13 will be monocrystalline with the same orientation as the monocrystalline silicon plate 9. See for example U.S. Patent 3,165,811.

When the desired thickness, for example, 14 microns, of the silicon layer 13 is obtained, oxygen is added to the stream of gas in the form of carbon dioxide, which results in the formation of the second stream of gas from which silicon oxide is deposited on the semiconductor layer. The carbon dioxide is added from a gas cylinder 29 through a gas flow meter 30 by opening the valve 23. The gas meter 30 has been adjusted, for example, to a flow of gas of 20 cm.$^3$ of carbon dioxide per minute. The gas meter 27 is then adjusted to a flow of gas of 20 cm.$^3$/min., as a result of which the hydrogen to which the carbon dioxide is added contains a smaller quantity (approximately ½% by volume) of silicon chloride and a favorable rate of growth of the silicon oxide layer is obtained. The second stream of gas also has approximately atmospheric pressure.

The quantity of added carbon dioxide preferably is at least twice the quantity of silicon chloride and less than the quantity of hydrogen. With large quantities of $CO_2$, the quality of the silicon oxide layer deteriorates, while a disturbing excess of water occurs.

The rate of growth of the silica layer is approximately 0.2μ/min.

When the desired thickness of the silicon oxide layer 14, for example a thickness of 1μ, is obtained, the silicon plate 9 is removed from the tube 1 after cooling.

The assembly 40 obtained is shown diagrammatically in cross-section on an enlarged scale in FIG. 2 and consists of the original silicon plate 9 having a thickness of 300 microns, a diameter of 25 mms., a resistivity of 0.01 ohm-cm. and of the n-conductivity type, of the deposited silicon layer 13, for example also of the n-type but having a resistivity of 1 ohm-cm. and a thickness of approximately 14 microns, and of the silicon oxide layer 14 having a thickness of approximately 1μ.

The conductivity type and the resistivity of the silicon layer 13 deposited from the vapor phase may be adjusted in a manner commonly used in semiconductor technology by simultaneously vaporizing in the vaporizer 28 compounds of impurities and thus, if desired, the semiconductor layer 13 may have another conductivity type than the plate 9.

For example, diode structures may be manufactured from the assembly 40 obtained by the well-known planar technique as described in U.S. Patent 3,025,589. For this purpose, for example, holes 41 (see FIG. 3) are provided in the silicon oxide layer 14, now serving as a mask, in a manner frequently used in semiconductor technology, for example, by means of a photo-hardening lacquer (also termed "photoresist") and an etching agent. Subsequently, p-type impurities, for example boron, are diffused through the holes 41 into the n-type layer 13, which results in the formation of p-type regions 42 and p-n junctions 43. By subdivision along the dotted lines 44, for example by scratching with a diamond and breaking, diode structures are obtained having a p-n junction 43 from which the ambient atmosphere is excluded at places at which it appears at the surface of the layer 13 by the remaining part of the silicon oxide layer 14, now serving as a protective layer, which favorably affects the electrical properties of the diode structure. The diode structures obtained can be provided with connecting leads in a manner commonly used in semiconductor technology.

With the aid of techniques similar to those described for the diode structures, it is also possible to manufacture, for example, transistor structures.

It will be appreciated that the invention is not limited to the embodiments described and that within the scope of the invention, many modifications are possible for a person skilled in the art. For example, the oxygen may be added in the form of pure oxygen (preferably less than 4% by volume) instead of in the form of carbon dioxide. It is also possible to add the oxygen in the form of water vapor, for example, by the injection of water vapor in the immediate proximity of the plate 9. Furthermore, the oxygen may be added in the form of $SO_2$, methanol vapor and, in principle, in any form which yields water vapor at higher or lower temperatures. The silicon compound may also consist, for example, of a silane, in which event the hydrogen can be entirely replaced by a rare gas. Furthermore, a semiconductor layer consisting of a material other than silicon, for instance of germanium or of a III–V compound, such as, for instance, GaP, GaAs or InP, can be deposited by deposition of a semiconductor material from the gas phase, while furthermore the plate 9 and the layer 13 may consist of different semiconductor materials. For example, a germanium layer can be deposited on a silicon plate by reduction of gaseous germanium chloride with hydrogen. In this case, before the silica layer is applied, for example, by thermal decomposition of an alkoxy silane, hydrogen or a rare gas or another gas which is inert with respect to the semiconductor materials used is preferably employed for rinsing. During a method in accordance with the invention, the semiconductor body need not be placed on a stationary support, but may also be placed, for example, on an endless belt adapted to be heated, and be conveyed with the aid of this belt through different parts of a reaction space, in which parts streams of gas of different compositions are maintained. The said parts of the reaction space may be separated from each other by lock-gate systems.

What is claimed is:

1. In the method of manufacturing a semiconductor device, the steps comprising providing a body of semiconductive material within a given apparatus, vapor-depositing on a surface of said body a grown first layer of semiconductive material having properties different from that possessed by the body, as a successive step in the same method and within the same apparatus vapor-depositing on the freshly-formed first layer of semiconductive material and extending over substantially the whole exposed surface thereof, a continuous, protective, second layer of silicon oxide which is substantially impervious to contaminants in the outside atmosphere before exposing the body and the first layer to the outside atmosphere and without an intervening etching, cleaning step, and thereafter, for further processing into at least one device, removing the body from the said given apparatus and exposing same to the outside atmosphere while the protective layer remains intact blocking access of undesired contaminants to the freshly-formed first layer.

2. A method as set forth in claim 1 wherein the first layer is of the same conductivity type as, but possesses a lower value of conductivity than, that of the body.

3. A method as set forth in claim 1 wherein the first layer is of the opposite conductivity type than that of the body.

4. A method as set forth in claim 1 wherein the body is a monocrystal, and the grown first layer is a monocrystal.

5. In the method of manufacturing a semiconductor device, the steps comprising providing a body of semiconductive material within a given apparatus, subjecting a surface of said body to a first atmosphere containing a compound of a semiconductive material which upon heating forms a vapor of the semiconductive material to vapor-deposit on said surface of said body a grown first layer of the latter semiconductive material having properties different from that possessed by the body, as a successive step in the same method and within the same apparatus in the presence of silicon subjecting a surface of the freshly-formed first layer of semiconductive material to a second atmosphere containing oxygen to vapor-deposit over substantially the whole exposed surface thereof, a continuous, protective, second layer of silicon oxide which is substantially impervious to contaminants in the outside at mosphere before exposing the body and the first layer to the outside atmosphere and without an intervening etching, cleaning step, and thereafter, for further processing into at least one device, removing the body from the said given apparatus and exposing same to the outside atmosphere while the protective layer remains intact blocking access of undesired contaminants to the freshly-formed first layer.

6. A method as set forth in claim 5 wherein the first layer is vapor-deposited by flowing through the said apparatus a first stream of a thermally-decomposable gaseous compound while heating the said body until the desired thickness of the first layer is attained, and the second layer is vapor-deposited by flowing through the said apparatus a second stream of gas containing oxygen until the desired thickness of the second layer is attained.

7. A method as claimed in claim 6 wherein the second gas stream contains a thermally-decomposable compound from which silicon oxide is obtained by thermal decomposition.

8. A method as set forth in claim 7 wherein the thermally-decomposable compound in the second stream is selected from the group consisting of methyl silicate, ethyl silicate and alkoxy silanes.

9. A method as claimed in claim 6 wherein after the first gas stream and before the second gas stream, a rinsing gas which is inert with respect to the body and the first layer is flowed through the apparatus.

10. In the method of manufacturing a semiconductor device, the steps comprising providing a body of semiconductive material within a given apparatus, flowing through the said apparatus and contacting a surface of said body while heating the body with a first stream of gas containing a decomposable gaseous silicon compound to decompose the gaseous compound and vapor-deposit on said surface of said body a grown first layer of silicon having properties different from that posssessed by the body until the desired thickness of first layer is obtained, as a successive step in the same method and within the same apparatus introducing into the first stream of gas an oxygen-containing substance to vapor-deposit over substantially the whole exposed surface of the freshly-formed first silicon layer, a continuous, protective second layer of silicon oxide which is substantially impervious to contaminants in the outside atmosphere until the desired thickness of said second layer is obtained before exposing the body and the first layer to the outside atmosphere and without an intervening etching, cleaning step, and thereafter, for further processing into at least one device, removing the body from said given apparatus and exposing same to the outside atmosphere while the protective layer remains intact blocking access of undesired contaminants to the freshly-formed first layer.

11. A method as claimed in claim 10 wherein the silicon compound is a silicon-halogen compound, the first gas stream contains hydrogen, and the oxygen is added in a form in which water vapor is formed in the gas stream.

12. A method as set forth in claim 10 wherein the body is a monocrystal, and the first layer is a monocrystal.

13. A method as set forth in claim 12 wherein the further processing includes etching at least one window in the silicon oxide layer and diffusing active impurities through the window into the underlying first layer to provide a region of altered conductivity within the first layer.

14. A method as claimed in claim 11 wherein oxygen is added to the first gas stream in the form of carbon dioxide.

15. In the method of manufacturing a semiconductor device, the steps comprising providing a body of silicon semiconductive material within a given apparatus, flowing through the said apparatus and contacting a surface of said body with a stream of hydrogen containing a decomposable gaseous silicon chloride compound while heating the body to decompose the compound and vapor-deposit on said surface of said body a grown first layer of silicon having properties different from that possessed by the body until the first layer has acquired the desired thickness, as a successive step in the same method and within the same apparatus introducing into the said stream of hydrogen and silicon chloride carbon dioxide while continuing to heat the body to vapor-deposit over substantially the whole exposed surface of the freshly-formed first layer, a continuous, protective second layer of silicon oxide which is substantially impervious to contaminants in the outside atmosphere until the desired thickness of said second layer is attained before exposing the body and the first layer to the outside atmosphere and without an intervening etching, cleaning step, and thereafter, for further processing into at least one device, removing the body from the said given apparatus and exposing same to the outside atmosphere while the protective layer remains intact blocking access of undesired contaminants to the freshly-formed first layer.

16. A method as set forth in claim 15 wherein the first layer has the same conductivity type as but higher resistivity than that of the body, and the quantity of carbon dioxide added is less than that of the hydrogen present but is at least twice that of the silicon chloride present.

References Cited

UNITED STATES PATENTS

| | | | |
|---|---|---|---|
| 2,763,581 | 9/1956 | Freedman | 148—175 |
| 2,815,462 | 12/1957 | Auphan | 148—174 |
| 2,849,583 | 8/1958 | Pritkin | 117—201 |
| 2,983,631 | 5/1961 | Hanlet | 148—174 |
| 3,055,776 | 9/1962 | Stevenson et al. | 148—187 |
| 3,063,867 | 11/1962 | Emery | 117—200 |
| 3,065,391 | 11/1962 | Hall | 148—175 |

OTHER REFERENCES

Doo et al.: Article in I.B.M. Technical Disclosure Bulletin, vol. 5, No. 2, July 1962, pp. 50–51.

Jacobson Encyclopedia of Chemical Reactions, vol. II, Reinhold Publishing Corp., 1948 ed., pp. 358–359.

Van Ligten: "Epitaxially Diffused Transistor Fabrication," I.B.M. Technical Disclosure Bulletin, vol. 4, No. 10, March 1962, pp. 58–59.

DAVID L. RECK, *Primary Examiner.*

HYLAND BIZOT, *Examiner.*

N. F. MARKVA, *Assistant Examiner.*